(12) United States Patent
Kanematsu et al.

(10) Patent No.: US 11,421,350 B2
(45) Date of Patent: Aug. 23, 2022

(54) ANTIBACTERIAL ELECTRIC CHARGE GENERATION YARN, METHOD FOR MANUFACTURING ANTIBACTERIAL ELECTRIC CHARGE GENERATION YARN, AND ANTIBACTERIAL CLOTH

(71) Applicants: TEIJIN FRONTIER CO., LTD., Osaka (JP); MURATA MANUFACTURING CO., LTD., Nagaokakyo (JP)

(72) Inventors: Shunsuke Kanematsu, Osaka (JP); Ryo Todo, Osaka (JP); Yuhei Ono, Osaka (JP); Tomoyoshi Yamamoto, Osaka (JP); Masamichi Ando, Nagaokakyo (JP); Satoshi Ishino, Nagaokakyo (JP)

(73) Assignees: TEIJIN FRONTIER CO., LTD., Osaka (JP); MURATA MANUFACTURING CO., LTD., Nagaokakyo (JP)

( * ) Notice: Subject to any disclaimer, the term of this patent is extended or adjusted under 35 U.S.C. 154(b) by 201 days.

(21) Appl. No.: 16/617,545

(22) PCT Filed: May 23, 2018

(86) PCT No.: PCT/JP2018/019759
§ 371 (c)(1),
(2) Date: Nov. 27, 2019

(87) PCT Pub. No.: WO2018/221332
PCT Pub. Date: Dec. 6, 2018

(65) Prior Publication Data
US 2020/0157709 A1    May 21, 2020

(30) Foreign Application Priority Data

May 30, 2017   (JP) .............................. JP2017-106518

(51) Int. Cl.
*D02G 3/02*      (2006.01)
*D02G 3/26*      (2006.01)
(Continued)

(52) U.S. Cl.
CPC ................. *D02G 3/02* (2013.01); *D02G 3/26* (2013.01); *D02G 3/449* (2013.01); *H01L 37/025* (2013.01);
(Continued)

(58) Field of Classification Search
None
See application file for complete search history.

(56) References Cited

U.S. PATENT DOCUMENTS

2009/0208695 A1    8/2009   Funatsu et al.

FOREIGN PATENT DOCUMENTS

CN     106700040    *   5/2017
JP      61-83346 A      4/1986
(Continued)

OTHER PUBLICATIONS

Machine translation of JP 2003234235 (Year: 2000).*
(Continued)

*Primary Examiner* — Shawn Mckinnon
(74) *Attorney, Agent, or Firm* — Sughrue Mion, PLLC (57) ABSTRACT

An antibacterial electric charge generation yarn meets requirements (a) to (e) mentioned below simultaneously and suppresses proliferation of bacteria by electric charge generated upon deformation of the yarn:
(a) a main component of the yarn is polylactic acid;
(b) the yarn is twisted;
(c) the yarn has a double torque of 50 T/50 cm or less;
(d) the yarn has a single fiber fineness of 0.05 to 5 dtex; and
(e) the number of filaments in the yarn is 10 to 400.

8 Claims, 2 Drawing Sheets

(51) Int. Cl.
*D02G 3/44* (2006.01)
*H01L 37/02* (2006.01)
*H01L 41/16* (2006.01)
*H01L 41/193* (2006.01)

(52) U.S. Cl.
CPC .... *D10B 2331/041* (2013.01); *D10B 2401/13* (2013.01); *H01L 41/16* (2013.01); *H01L 41/193* (2013.01)

(56) References Cited

FOREIGN PATENT DOCUMENTS

| JP | 5-12475 B2 | 2/1993 |
|----|------------|--------|
| JP | 5-279970 A | 10/1993 |
| JP | 5-295670 A | 11/1993 |
| JP | 7-310274 A | 11/1995 |
| JP | 8-81854 A | 3/1996 |
| JP | 8-226078 A | 9/1996 |
| JP | 9-194304 A | 7/1997 |
| JP | 2000-144545 A | 5/2000 |
| JP | 2000-234235 A | 8/2000 |
| JP | 2001-49097 A | 2/2001 |
| JP | 3165992 B2 | 5/2001 |
| JP | 3281640 B2 | 5/2002 |
| JP | 2003-293221 A | 10/2003 |
| JP | 2004-300650 A | 10/2004 |
| JP | 2006-274520 A | 10/2006 |
| WO | 2007/029688 A1 | 3/2007 |
| WO | 2011/034113 A1 | 3/2011 |
| WO | 2016175321 A1 | 11/2016 |

OTHER PUBLICATIONS

Machine translation of JPS6183346 (Year: 1986).*
Machine translation of JPH05279970 (Year: 1993).*
Machine translation of JPH05295670 (Year: 1993).*
Machine translation of JPH0881854 (Year: 1996).*
Machine translation of CN 106700040 (Year: 2017).*
Machine translation of JP2001049097 (Year: 2001).*
Machine translation of JP2003293221 (Year: 2003).*
Machine translation of WO2011034113 (Year: 2011).*
T. Tsuchido et al., "Microorganism Control—Science and Engineering", p. 50, section 4.1.3, 2002 (3 pages total).
Koichi Takaki, "Agricultural and Food Processing Applications of High-Voltage and Plasma Technologies", J. HTSJ, vol. 51, No. 216, pp. 64-69, 2012 ( 8 pages total).
Eiichi Fukada, "Piezoelectricity in Biopolymers", Polymer, vol. 16, No. 9, pp. 795-800, 1967 (7 pages total).
International Search Report dated Jul. 17, 2018, in International Application No. PCT/JP2018/019759.
International Preliminary Report on Patentability with translation of Written Opinion dated Dec. 3, 2019 in International Application No. PCT/JP2018/019759.
Communication dated Jan. 28, 2021, from the European Patent Office in European Application No. 18809090.6.
Communication dated Feb. 9, 2021, from the European Patent Office in European Application No. 18809090.6.
Communication dated Jan. 5, 2021, from the Japanese Patent Office in Application No. 2019-522150.

* cited by examiner

ANTIBACTERIAL ELECTRIC CHARGE GENERATION YARN, METHOD FOR MANUFACTURING ANTIBACTERIAL ELECTRIC CHARGE GENERATION YARN, AND ANTIBACTERIAL CLOTH

CROSS REFERENCE TO RELATED APPLICATIONS

This application is a National Stage of International Application No. PCT/JP2018/019759 filed May 23, 2018, claiming priority based on Japanese Patent Application No. 2017-106518 filed May 30, 2017.

TECHNICAL FIELD

The present invention relates to a yarn having antibacterial properties, and a fabric cloth, a garment or a medical member in each of which the yarn is used.

BACKGROUND ART

Heretofore, many fibrous materials having antibacterial properties have been proposed (see Patent Literatures 1 to 7).

CITATION LIST

Patent Literatures

[Patent Literature 1]
 Japanese Patent No. 3281640
[Patent Literature 2]
 Japanese Patent Application Lying-open No. 7-310284
[Patent Literature 3]
 Japanese Patent No. 3165992
[Patent Literature 4]
 Japanese Patent No. 1805853
[Patent Literature 5]
 Japanese Patent Application Lying-open No. 8-226078
[Patent Literature 6]
 Japanese Patent Application Lying-open No. 9-194304
[Patent Literature 7]
 Japanese Patent Application Lying-open No. 2004-300650

SUMMARY OF INVENTION

Technical Problem

However, in all of materials having antibacterial properties, the effect thereof does not last for a long period.

Furthermore, materials having antibacterial properties may cause allergic reactions with chemical substances and the like.

Then, the object of the present invention is to provide an antibacterial fiber of which the effect can last for a longer period than the conventional antibacterial materials and which is highly safe than chemical substances and the like.

Solution to Problem

The antibacterial electric charge generation yarn according to the present invention meets requirements (a) to (e) mentioned below simultaneously:
(a) a main component of the yarn is polylactic acid;
(b) the yarn is twisted;
(c) the yarn has a double torque of 50 T/50 cm or less;
(d) the yarn has a single fiber fineness of 0.05 to 5 dtex; and
(e) a number of filaments in the yarn is 10 to 400.

The antibacterial electric charge generation yarn according to the present invention contains polylactic acid having piezoelectric properties as the main component and generates electric charge upon deformation thereof.

Heretofore, it is known that the proliferation of a bacteria or a fungus can be suppressed by means of an electric field (see, for example, "Biocontrol; Science and Industries", attributed by Tetsuaki Tsuchido, Hironori Kourai, Hideaki Matsuoka, Junichi Koizumi, published by Kodansha, or "Agricultural and Food Processing Applications of High-Voltage and Plasma Technologies", attributed by Koichi Takaki, J. HTSJ, Vol. 51, No. 216). In addition, an electric current may flow through an electric current pathway that is formed by moisture or the like or through a circuit that is formed as the result of the occurrence of a local micro-scale electric discharge phenomenon or the like, by means of a potential that generates the electric field. It is believed that the electric current can weaken a bacterium and can suppress the proliferation of the bacterium. The antibacterial electric charge generation yarn according to the present invention comprises polylactic acid fibers that generates the electric charge upon deformation thereof, i.e., has piezoelectric properties. Therefore, an electric field can be generated between the yarns, or an electric field can be gene rated when the yarn comes close to an object having a given potential (including a ground potential) such a human body. Alternatively, the antibacterial electric charge generation yarn of the present invention can cause an electric current to flow between the yarns or between the yarn and an object having a given potential (including a ground potential) such a human body when the yarn comes close to the object, through moisture such as sweat.

Therefore, it is considered that the antibacterial electric charge generation yarn according to the present invention can exhibit a bacteriostatic effect (i.e., an effect to suppress the occurrence of a bacterium) or a bactericidal effect (i.e., an effect to kill a bacterium) for the following reasons. When the antibacterial electric charge generation yarn is applied to an article (a garment, a footwear, a medical product such as a mask) which comes close to an object having a given potential such as a human body upon use, an electric field or an electric current is generated and a cell membrane of a bacterium or an electron transfer system necessary for the maintenance of the life of a bacterium is interfered by the direction action of the electric field or the electric current, leading to the death or weakening of the bacterium. Furthermore, there is a case where oxygen contained in moisture is changed into an active oxygen species by means of the electric field or the electric current, or there is a case where oxygen radical is generated in a cell of a bacterium due to a stress environment associated with the presence of the electric field or the electric current. By the action of the active oxygen species including the radical, a bacterium is killed or weakened. Alternatively, the bacteriostatic effect or the bactericidal effect may be developed for a combination of above-mentioned reasons.

The antibacterial electric charge generation yarn according to the present invention contains polylactic acid having piezoelectric properties as the main component and generates an electric field due to the piezoelectric properties thereof. Accordingly, no power source is needed, or there is no concern about electric shock. The piezoelectric properties are come from the crystalline structure of polylactic acid. Therefore, the effect to suppress the proliferation of a bacterium can last longer than the antibacterial effect of chemical substances or the like. Furthermore, the antibacterial electric charge generation yarn has a lower possibility of the occurrence of an allergic reaction than a chemical substance.

Advantageous Effects of Invention

According to the present invention, it becomes possible to provide an antibacterial electric charge generation yarn which can keep the effect thereof for a longer period compared with the conventional antibacterial materials and is more highly safe than chemical substances or the like.

DESCRIPTION OF EMBODIMENTS

Hereinbelow, the embodiments of the present invention will be described in detail.

The antibacterial electric charge generation yarn according to the present invention meets requirements (a) to (e) mentioned below simultaneously:
(a) a main component of the yarn is polylactic acid;
(b) the yarn is twisted;
(c) the yarn has a double torque of 50 T/50 cm or less;
(d) the yarn has a single fiber fineness of 0.05 to 5 dtex; and
(e) a number of filaments in the yarn is 10 to 400.

If necessary, the antibacterial electric charge generation yarn according to the present invention additionally meets requirements (f) to (j) mentioned below:
(f) the yarn has an optical purity of 95 to 100%;
(g) a concentration of carboxyl terminal groups in the yarn is 0 to 10 mol/ton;
(h) the yarn has a crystallization degree of 30 to 60%;
(i) the yarn has a fiber strength of 1.5 to 10 cN/dtex; and
(j) the yarn has a resistivity of 1 MΩ/m or more.
(Polylactic Acid)

In the antibacterial electric charge generation yarn according to the present invention, the main component is polylactic acid. The term "mainly" refers to a fact that the component makes up 60% or more of the total amount of the constituent components of the yarn.

Polylactic acid is categorized into poly-L-lactic acid produced by polymerizing L-lactic acid or L-lactide, poly-D-lactic acid produced by polymerizing D-lactic acid or D-lactide, and stereo-complex polylactic acid of which the structure is a hybrid of those of poly-L-lactic acid and poly-D-lactic acid, depending on the crystalline structure thereof. Any one of these types of polylactic acid may be used, as long as the polylactic acid can exhibit piezoelectric properties. From the viewpoint of achieving a high piezoelectric modulus, poly-L-lactic acid and poly-D-lactic acid are preferred. The polarization of poly-L-lactic acid against a stress (deformation) and that of poly-D-lactic acid against the same stress (deformation) are opposite to each other. Therefore, in the present invention, a more preferred structure can be formed by adopting a specific arrangement, as mentioned below.

The optical purity of polylactic acid is preferably 95% or more, more preferably 97% or more, still more preferably 99% or more. If the optical purity is less than 95%, the crystallinity and the piezoelectric modulus may be deteriorated significantly, often resulting in the difficulty in the achievement of satisfactory antibacterial properties upon deformation.

The optical purity of polylactic acid is expressed as a ratio of the number of moles of an L-lactic acid monomer or the number of moles of a D-lactic acid monomer, whichever is larger, to the total number of moles of all of lactic acid monomers constituting the polylactic acid.

Polylactic acid can exhibit the piezoelectric properties thereof upon undergoing a molecule orientation treatment by stretching. Therefore, a polling processing is not necessary for polylactic acid, unlike other piezoelectric polymers such as PVDF or piezoelectric ceramics. Monoaxially stretched polylactic acid has a piezoelectric constant of about 5 to 30 pC/N, and has an extremely large piezoelectric constant among polymers. Furthermore, the piezoelectric constant of polylactic acid is never changed over time, and is extremely stable.

Polylactic acid is a polyester which can be hydrolyzed relatively rapidly. Therefore, in the case where wet heat resistance is a concern, a known hydrolysis inhibitor, such as an isocyanate compound, an oxazoline compound, an epoxy compound and a carbodiimide compound, may be added. If necessary, an antioxidant gent such as a phosphoric acid-based compound, a plasticizer, a light degradation inhibitor and the like may be added for the purpose of improving the properties of polylactic acid.

From the viewpoint of preventing the hydrolysis of polylactic acid, the concentration of carboxyl ends in the polylactic acid is preferably 10 mol/ton or less, more preferably 5 mol/ton or less. The concentration of carboxyl ends in a commonly available polylactic acid is more than 10 mol/ton, and the concentration of carboxyl ends is further increased when the content of a low-molecular-weight component such as lactic acid, lactide and an oligomer is large. In this case, however, the concentration of carboxyl ends can be decreased by using an end-capping agent such as an isocyanate compound, an oxazoline compound, an epoxy compound and a carbodiimide compound.

From the viewpoint of keeping the below-mentioned fiber strength, the weight-average molecular weight of polylactic acid is preferably 50,000 to 1,000,000 inclusive, more preferably 100,000 to 300,000 inclusive.

Polylactic acid may be used in the form of an alloy with another polymer. In this case, the alloy contains polylactic acid preferably in an amount of 50% by mass or more, more preferably 70% by mass or more, most preferably 90% by mass or more, relative to the whole mass of the alloy.

In the alloy, preferred examples of the polymer other than polylactic acid include, but are not limited to, polybutylene terephthalate, polyethylene terephthalate, polytrimethylene terephthalate, polyethylene naphthalate, a copolymer of any two members among them and polymethacrylate, and any polymer may be used as long as the piezoelectric properties desired in the present invention can be achieved.
(Twist Factor)

As one typical form of the antibacterial electric charge generation yarn of the present invention, a twisted yarn composed of polylactic acid molecules which are monoaxially oriented (also referred to as a "polylactic acid twisted yarn 1" hereinafter) can be mentioned.

In a chiral polymer such as polylactic acid, the main chain has a spiral structure. A chiral polymer can exhibit piezoelectric properties when molecules thereof are monoaxially stretched to cause the molecules to be oriented. With respect to a monoaxially stretched polylactic acid filament, when the direction of the stretching of the filament, i.e., the direction of the orientation of polylactic acid molecules, is defined as a third axis and two axes both of which are orthogonal to the third axis and which are orthogonal to each other are defined as a first axis and a second axis, respectively, the filament has tensor components having piezoelectric strain constants of $d14$ and $d25$, respectively. Therefore, polylactic acid generates electric charge upon the generation of an elongation-contraction strain at an angle larger than 0 degree or an angle smaller than 90 degrees relative to the direction of the stretching, and the amount of the electric charge generated by the strain increases as the elongation-contraction strain angle becomes closer to 45 degrees. Namely, when an elongation-contraction strain is generated in a direction of 45 degrees, the electric charge is generated most efficiently. Therefore, the generation of the electric charge due to the piezoelectric properties of polylactic acid upon the elastic deformation of fibers can be achieved effectively by tilting the stretching direction (i.e., the direction of the orientation of polylactic acid molecules) toward a direction at 45 degrees to the length direction of the fibers.

In the polylactic acid twisted yarn 1, the direction of orientation of polylactic acid is tilted against the length direction of fibers (polylactic acid twisted yarn 1). Therefore, the generation of the electric charge due to the piezoelectric properties of polylactic acid can be achieved effectively by the elastic deformation in the length direction of the fibers (polylactic acid twisted yarn 1) Furthermore, because the twisted yarn is axis-symmetry about the center axis thereof, the generation of the electric charge due to the piezoelectric properties of polylactic acid which is caused by the elastic deformation in the length direction of the polylactic acid twisted yarn 1 also occurs in an axis-symmetry manner. For example, positive electric charge is generated on the center axis of the polylactic acid twisted yarn 1, and negative electric charge is generated on the outer surface of the polylactic acid twisted yarn 1 at an arbitrary part of the polylactic acid twisted yarn 1.

As mentioned above, in order to effectively cause the generation of the electric charge due to the piezoelectric properties of polylactic acid by the elastic deformation in the length direction of the polylactic acid twisted yarn 1, the tilting of polylactic acid molecules is critical, and it is preferred the twist factor represented by formula (1) falls within the range from 500 to 50000 $T/m \cdot (dtex)^{1/2}$.

$$\text{Twist factor}(T/m \cdot (dtex)^{1/2}) = (\text{number of twists})(T/m) \times (\text{total fineness of twisted yarn}(dtex))^{1/2} \quad (1)$$

As mentioned above, the polylactic acid twisted yarn 1 generates negative electric charge on the surface thereof and generates positive electric charge in the inside therein when an external force is applied to the polylactic acid twisted yarn 1. The polylactic acid twisted yarn 1 generates an electric field as the result of the difference in potential which is caused by means of the electric charge. The electric field is leaked in a space in the vicinity thereof to form a coupled electric field with another part. When the polylactic acid twisted yarn 1 comes close to an object having a given potential, such as an object having a given potential (including a ground potential) (e.g., a human body), the potential generated in the polylactic acid twisted yarn 1 causes the generation of an electric field between the polylactic acid twisted yarn 1 and the object.

As mentioned above, it is known that the proliferation of a bacteria or a fungus can be suppressed by an electric field (see, for example, "Biocontrol; Science and Industries", attributed by Tetsuaki Tsuchido, Hironori Kourai, Hideaki Matsuoka, Junichi Koizumi, published by Kodansha, and "Agricultural and Food Processing Applications of High-Voltage and Plasma Technologies", attributed by Koichi Takaki, J. HTSJ, Vol. 51, No. 216). In addition, an electric current may flow through an electric current pathway that is formed by moisture or the like or through a circuit that is formed as the result of the occurrence of a local micro-scale electric discharge phenomenon or the like, by means of a potential that generates the electric field. It is believed that the electric current can weaken a bacterium and can suppress the proliferation of the bacterium. In this embodiment, the term "bacterium" includes, within the scope thereof, a bacterium, a fungus, a microorganism such as a tick and a flare, and a virus.

Therefore, the polylactic acid twisted yarn 1 can exhibit a bacteriostatic effect or a bactericidal effect directly by the action of an electric field formed in the vicinity of the polylactic acid twisted yarn 1 or an electric field generated when the polylactic acid twisted yarn 1 comes close to an object having a given potential such as a human body. Alternatively, the polylactic acid twisted yarn 1 can cause the flow of an electric current when comes close to another adjacent fiber or an object having a given potential such as a human bod through moisture such as sweat. The bacteriostatic effect or the bactericidal effect may also be caused directly by means of this electric current. Alternatively, the bacteriostatic effect or the bactericidal effect may be caused indirectly by the action of an active oxygen species which is produced by modifying oxygen contained in moisture by the action of an electric current or a voltage or a radical species which is generated by the interaction with an additive material contained in the fibers or a catalytic action or another antibacterial chemical species (e.g., an amine derivative). Alternatively, oxygen radical may be generated in cells of a bacterium due to a stress environment which is induced by the presence of by an electric field or an electric current. Examples of the radical include super-oxide anion radical (active oxygen) and hydroxy radical.

From the viewpoint of generating an electric charge efficiently by the elastic deformation of the antibacterial electric charge generation yarn, the twist factor is preferably 1000 to 30000 $T/m \cdot (dtex^{1/2})$, more preferably 10000 to 20000 $T/m \cdot (dtex^{1/2})$.

In this case, the total fineness of the antibacterial electric charge generation yarn is preferably 30 to 1000 dtex, more preferably 50 to 500 dtex. The total fineness is a fineness of a single twisted yarn. In the case where the yarn is combined with another yarn or the like, the total fineness is evaluated with respect to the single twisted yarn before the combination with another yarn.

The evaluation of the total fineness is carried out in the following manner. The weight of each of samples, each of which is prepared by cutting a twisted yarn sample to a length of 10 m, is measured while applying an initial load of 25 mN to the sample and while avoiding the untwisting of the sample. The value is multiplied with 1,000. The values obtained for two yarns (n==2) are averaged to determine the total fineness (dtex).

The antibacterial electric charge generation yarn of the present invention has a single fiber fineness of 0.05 to 5 dtex and contains 10 to 400 filaments. If the single fiber fineness is small and the number of filaments is too large, fluffing may occur. If the single fiber fineness is large and the number of filaments is too small, the texture may be deteriorated.

In the antibacterial electric charge generation yarn of the present invention, it is preferred that the crystallization degree of polylactic acid is 30 to 60%. In this case, the piezoelectric properties coming from a polylactic acid crystal is increased and therefore the generation of the electric charge can be caused effectively due to the piezoelectric properties of polylactic acid. As a result, a higher antibacterial effect can be achieved. From this viewpoint, the crystallization degree of polylactic acid in the twisted yarn is more preferably 40% or more.

It is preferred that the antibacterial electric charge generation yarn of the present invention has a fiber strength of 1.5 to 10 cN/dtex. In this case, the fibers can further withstand deformation needed for the generation of the electric charge by the piezoelectricity of polylactic acid. From this viewpoint, the fiber strength of the antibacterial electric charge generation yarn is more preferably 2 to 10 cN/dtex, still more preferably 3 to 10 cN/dtex, most preferably 3.5 to 10 cN/dtex.

It is preferred that the antibacterial electric charge generation yarn of the present invention has a resistivity of 1 MΩ/m or more. In this case, it becomes possible to prevent the electric charge generated by deformation from passing through the surfaces of the fibers and, as a result, a higher antibacterial effect can be achieved. From this viewpoint, in the antibacterial electric charge generation yarn, the resistivity of polylactic acid is more preferably 100 MΩ/m or more. In this regard, the term "resistivity" as used herein refers to a resistivity measured in the direction of the length of a single twisted yarn, and is evaluated by cutting a single twisted yarn to a length of 1 m, then gripping both ends of the cut twisted yarn by electrodes, then holding the gripped twisted yarn in air, and then measuring a resistivity between the electrodes at the both ends with a tester.

(Production of Polylactic Acid Raw Yarn)

For the production of a polylactic acid raw yarn which is used for providing a twisted yarn of a polylactic acid resin, any known technique for producing fibers from a polymer can be employed, as long as the effects of the present invention can be achieved. Examples of the technique to be employed include: a technique in which a polylactic acid resin is extrusion-molded to produce fibers; a technique in which a polylactic acid resin is melt-spun to produce fibers; a technique in which a polylactic acid resin is formed into fibers by a dry-mode or wet-mode spinning; a polylactic acid resin is formed into fibers by electrostatic spinning; and a technique in which a polylactic acid resin is formed into a film and then the film is cut into thin pieces. With respect to these spinning conditions, a known technique may be employed depending on the type of a polylactic acid resin to be used, and a melt spinning method which enables the easy industrial production of the fibers is generally employed. After the formation of the fibers, the fibers are stretched. In this manner, a polylactic acid raw yarn which is monoaxially stretched and oriented, contains crystals and can exhibit high piezoelectricity can be formed.

(Production of Twisted Yarn)

Twisting is carried out through, for example, the following steps. An untwisted polylactic acid raw yarn is subjected to the twisting using a twister such as a double twister (e.g., a product manufactured by Murata Machinery, Ltd.) under the conditions of a spindle rotation number of 5000 to 15000 rpm and a yarn twisting tension of 10 to 50 g in an arbitrary direction to produce a twisted yarn.

For the purpose of avoiding the excessive deformation of the fibers or the fusion of the fibers to each other due to the tight winding of the fibers during thermal setting, it is preferred that the polylactic acid raw yarn to be subjected to a twisting step has a crystallization degree of 30% or more, an orientation degree of 80% or more and a shrinkage ratio in boiling water of 15% or less. For the purpose of achieving uniform twisting, it is also preferred that the twisting is carried out using polylactic acid fibers each having an Uster irregularity of 3% or less.

(Thermal Setting)

The antibacterial electric charge generation yarn of the present invention can exhibit piezoelectricity-associated antibacterial properties more easily when the structures of twisted filaments thereof are fixed. However, if the filaments are strongly twisted at a twist factor of 500 T/m·(dtex$^{1/2}$) or more, the twisted filaments may be untwisted. If untwisted, such a problem may be produced that the desired piezoelectric properties and antibacterial properties may be deteriorated, and that the handling (e.g., weaving, knitting) of the filaments may become extremely difficult due to spontaneous twisting of the twisted yarn. In the antibacterial electric charge generation yarn of the present invention, for solving this problem, proper thermal setting conditions as mentioned below are employed after the above-mentioned twisting step. As a result, the problem of difficulty in handling (e.g., weaving, knitting) can be solved, the undesirable twisting of the twisted yarn can be prevented, the deterioration in piezoelectricity-associated antibacterial properties can be prevented, and the object of the present invention can be achieved. From these viewpoints, in the antibacterial electric charge generation yarn of the present invention, the double torque, which is a measure of the unlikeliness of untwisting, is preferably 50 T/50 cm or less, more preferably 30 T/50 cm or less, still more preferably 20 T/50 cm or less.

The double torque can be measured in the following manner. A twisted yarn having a length of 1 m is sampled on a desk while avoiding the application of a tension of 1 g or more to the twisted yarn. An end of a twisted yarn at which the twisted yarn is cut previously may be untwisted. Therefore, the sampling is carried out at a part of the twisted yarn which is 1 m or longer apart from the end. In the sampling, an adhesive tape is attached to a cutting position in the twisted yarn before the twisted yarn is cut, so that the twisted yarn cannot be untwisted spontaneously after the cutting.

An end of the sampled twisted yarn having a length of 1 m is passed through a hole of a gem clip having a weight of 0.4 g, and then the gel clip is moved to the center part (a part positioned 50 cm apart from of the end) of the twisted yarn. In this test, care should be taken not to apply a tension to the twisted yarn or not to twist or untwisted the twisted yarn during the passing of the twisted yarn through the hole of the gem clip and the movement of the gem clip.

Both ends of the twisted yarn are held up slowly by both hands, and then the both ends are put together. The ends of the yarn which are put together are fixed to a joist with an adhesive tape so as to suspend the gem clip on the yarn. The combined two twisted yarns are entangled spontaneously due to the twist of the twisted yarns and, as a result, the gem clip is rotated.

The yarns are allowed to leave for five minutes until the rotational motion of the gem clip stops. Subsequently, the yarns are rotated in an inverse direction to the direction of the rotational movement of the gem clip until the two twisted yarns are untwisted, and the number of rotations of the gem clip is measured at a precision of 0.5.

The sampling and the measurement are repeated five times, and the measurement values are averaged to determine a double torque value (T/50 cm).

As mentioned above, it is preferred that the thermal setting is carried out under conditions where the double torque can become 50 T/50 cm or less. From this viewpoint, a higher thermal setting temperature and a longer thermal setting time are preferred. However, the physical properties may be deteriorated when the thermal setting is carried out at a higher temperature for a longer period. For these reasons, in the thermal setting, the temperature is preferably 60 to 140° C., more preferably 80 to 120° C., and the time is preferably 10 to 240 minutes, more preferably 15 to 120 minutes. The thermal setting is preferably carried out in a wet heat atmosphere. For example, thermal setting using a steam vacuum setter is preferred.

From the viewpoint of fixing the structure of the twisted yarn effectively, it is preferred to carry out the thermal setting while winding the twisted yarn around a bobbin or while applying a tension to the yarn between rollers, and it is also preferred that the temperature rising rate to the thermal setting temperature is 50° C./min. or less. If the temperature rising rate is too large, the fusion between fibers or the deterioration in properties of the fibers due to uneven heating may occur.

From the viewpoint of preventing the hydrolysis-induced deterioration in properties of the fibers, it is preferred that the thermal setting is carried out at a relative humidity of 40% or less or under a reduced pressure. Furthermore, it is preferred that a carboxyl end capping agent is contained as a hydrolysis inhibitor, and it is also preferred that the rate of the decrease in weight-average molecular weight, which may be caused as the result of the thermal setting treatment, is 20% or less.

The thermal setting may be carried out in multiple stages. In this case, it is preferred that the above-mentioned conditions are satisfied in at least one stage among the multiple stages.

(Measurement of Crystallization Degree and Orientation Degree)

The crystallization degree of polylactic acid (crystallization degree of homopolylactic acid) and the orientation degree (crystal orientation degree) as mentioned above are measured in the following manner.

(1) Crystallization Degree $X_{homo}$ of Homopolylactic Acid:

The crystallization degree $X_{homo}$ of homopolylactic acid is determined by a crystalline structure analysis by wide angle x-ray diffraction analysis (WAXD). In wide angle x-ray diffract ion analysis (WAXD), an X-ray diffraction image is recorded on an imaging plate under the below-mentioned conditions by a transmission method using an ultrax18 model X-ray diffraction device manufactured by Rigaku Corporation.

X-ray source: Cu-Kα line (a confocal mirror)
Output: 45 kV×60 mA
Slit: 1st: 1 mmΦ, 2nd: 0.8 mmΦ
Camera length: 120 mm
Cumulative time: 10 minutes
Sample: Polylactic acid fibers each having a weight of 35 mg are paralleled to form a fiber bundle having a length of 3 cm.

In the X-ray diffraction image thus obtained, the total scattering intensity $I_{total}$ is determined at azimuth angles, and the sum total $\Sigma I_{HMi}$ Of integrated intensities of the individual diffraction peaks which come from a homopolylactic acid crystal and appear around 2θ=16.5°, 18.5° and 24.3° is determined. The crystallization degree $X_{homo}$ of homopolylactic acid is determined from these values in accordance with formula (2) shown below.

$$\text{Crystallization degree } X_{homo}(\%) \text{ of homopolylactic acid} = \Sigma I_{HMi}/I_{total} \times 100 \qquad (2)$$

The $\Sigma I_{HMi}$ is calculated by subtracting the intensity of background or diffuse scattering associated with amorphous state in the total scattering intensity.

(2) Crystal Orientation Degree Ao:

A crystal orientation degree Ao of homopolylactic acid is determined in the following manner: in the X-ray diffraction image obtained above by the wide angle X-ray diffraction analysis (WAXD), an intensity distribution of diffraction peaks which come from a homopolylactic acid crystal and appear around 2θ=16.5° in a radial direction is obtained at azimuth angles (°) and then the crystal orientation degree Ao of homopolylactic acid is calculated from the sum total $\Sigma W_i(°)$ of half-value widths of the distribution profile in accordance with formula (3).

$$\text{Crystal orientation degree } Ao(\%) = (360 - \Sigma W_i) \div 360 \times 100 \qquad (3)$$

(Combination of Twisted Yarns)

In the present invention, multiple types of the antibacterial electric charge generation yarns may be combined in a twisted yarns form upon use, if necessary. In this regard, the electric charge generated on the surface of an S-twisted yarn mainly composed of poly-L-lactic acid and the electric charge generated on the surface of a Z-twisted yarn mainly composed of poly-L-lactic acid are opposed to each other upon the elongation-contraction deformation. Therefore, it is preferred to place these twisted yarns close to each other, because the electric field generated between the fibers can become larger and the antibacterial properties can be increased. For the same reason, it is also referred to use a combination of an S-twisted yarn mainly composed of poly-L-lactic acid and an S-twisted yarn mainly composed of poly-D-lactic acid, a combination of a Z-twisted yarn mainly composed of poly-L-lactic acid and a Z-twisted yarn mainly composed of poly-D-lactic acid, or a combination of an S-twisted yarn composed of poly-D-lactic acid and a Z-twisted yarn mainly composed of poly-D-lactic acid. Namely, it is preferred to allow [at least one antibacterial electric charge generation yarn selected from an S-twisted yarn mainly composed of poly-L-lactic acid and a Z-twisted yarn mainly composed of poly-D-lactic acid] and [at least one antibacterial electric charge generation yarn selected from a Z-twisted yarn mainly composed of poly-L-lactic acid and an S-twisted yarn mainly composed of poly-D-lactic acid] to come close to each other.

The method for allowing the above-mentioned two types of twisted yarns to come close to each other may be selected arbitrarily. Examples of the method include: a method in which two types of twisted yarns as mentioned above are combined to each other previously to form a strand; and a method in which two types of twisted yarns as mentioned above are used in combination as yarns constituting a fabric cloth. The term "fabric cloth" or "cloth" as used in the present invention refers to a fiber product such as a woven fabric, a knitted fabric, a braided fabric, a non-woven fabric, and a lace. Hereinafter, the term. "fabric cloth" is used in the same meaning as the term "cloth". In the case where it is intended to produce a woven or knitted fabric, it is preferred to employ a texture in which the number of positions at which the two types of twisted yarns come close to each other.

(Fabric Cloth Using the Antibacterial Electric Charge Generation Yarn)

The antibacterial electric charge generation yarn capable of generating the electric charge upon deformation can be applied to products including various garments and medical members. For example, the antibacterial electric charge generation yarn can be applied to an underwear (particularly socks), towel, an insole for shoes, boots or the like, a general sportswear, a hat or cap, a bedclothing (including a bedding, a mattress, a sheet, a pillow, a pillow cover), a tooth brush, a floss, a filter (e.g., a filter for a water purifier, an air conditioner or an air cleaner), a stuffed toy, a pet animal-related product (e.g., a mat for pet animals, a clothing for pet animals, an inner for a clothing for pet animals), a mat product (e.g., a mat for a foot, a hand or a toilet seat), a curtain, a kitchen good (e.g., a sponge, a dishcloth), a sheet (e.g., a sheet for vehicles, trains, airplanes and the like), a cushioning material and an exterior material for a brain bucket for motorbikes), a sofa, a bandage, a gauze, a mask, a suture, a clothing for a physician or a patient, a supporter, a sanitary product, a sporting good (e.g., a wear, an inner for globes, an arm guard for a Japanese material sport), and a packaging material.

Particularly in socks (or a supporter) among these garments, expansion/contraction inevitably occurs along a joint during a motion such as walking, and therefore the antibacterial electric charge generation yarn generates the electric charge at high frequency. Socks can absorb moisture (water) such as sweat and therefore can become a hotbed for the proliferation of bacteria. The antibacterial electric charge generation yarn can suppress the proliferation of bacteria and therefore can exhibit a significant effect for antibacterial purposes.

As exemplified above, a fabric cloth containing the antibacterial electric charge generation yarn of the present invention can be used as an antibacterial fabric cloth.

Figure 1A:
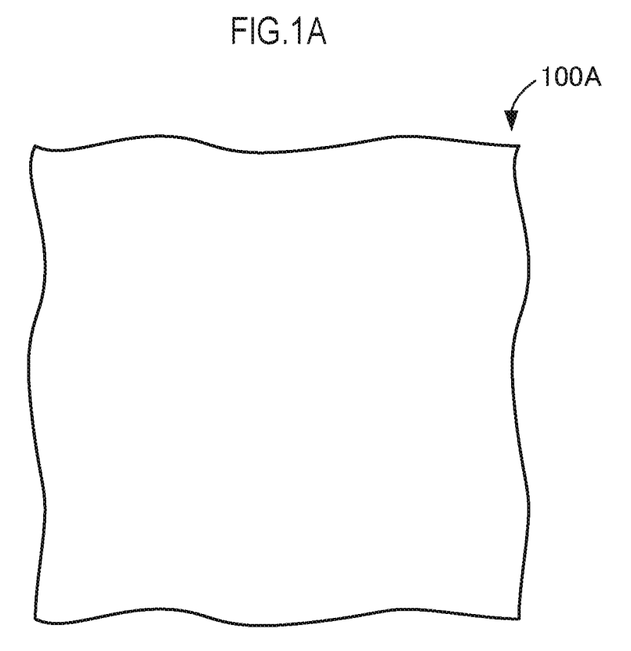
FIG. 1A is a planar schematic view of a cloth 100A.
Figure 1B:
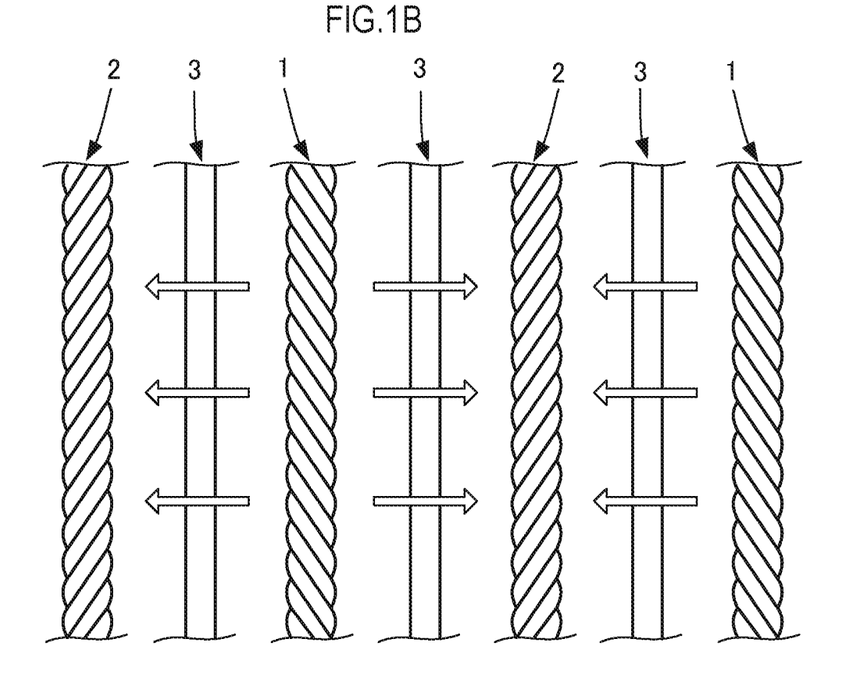
FIG. 1B is a view illustrating an electric field generated between yarns.

FIG. 1(A) is a planar schematic view of a cloth 100A, and FIG. 1(B) is a view illustrating an electric field generated between yarns.

A cloth 100A shown in FIGS. 1(A) and 1(B) is composed of a polylactic acid twisted yarn 1 (an S-twisted yarn made from poly-L-lactic acid), a polylactic acid twisted yarn 2 (a Z-twisted yarn made from poly-L-lactic acid) and an ordinary yarn 3 which are woven together. The ordinary yarn 3 is a yarn provided with no piezoelectric body, and corresponds to a dielectric body.

In the example shown in FIG. 1(B), the polylactic acid twisted yarn 1, the polylactic acid twisted yarn 2 and the ordinary yarn 3 are arranged in parallel with one another. The polylactic acid twisted yarn 1 and the polylactic acid twisted yarn 2 are arranged a specified distance apart from each other with the ordinary yarn 3, which corresponds to the dielectric body interposed therebetween. The polarity of the electric charge generated in the polylactic acid twisted yarn 1 and that generated in the polylactic acid twisted yarn 2 are different from each other. The difference in potential at each position can be defined by an electric field coupled circuit formed by complexly entangling the yarns with each other or a circuit formed by an electric current path that is formed by accident in the yarn by the action of moisture or the like. Therefore, when an external force is applied to the yarns, an electric field shown by a white arrow in the drawing is generated between the polylactic acid twisted yarn 2 that generates the positive electric charge and the polylactic acid twisted yarn 1 that generates the negative electric charge. In this regard, the ordinary yarn 3 is not an essential component. An electric field can be generated between the polylactic acid twisted yarn 1 and the polylactic acid twisted yarn 2 without the presence of the ordinary yarn 3. In the polylactic acid twisted yarn 1 alone, the surface has negative potential and the inside has positive potential when a tension is applied to the yarn in the polylactic acid twisted yarn 2 alone, on the contrary, the surface has positive potential and the inside has negative potential when a tension is applied to the yarn. When these yarns come close to each other, the yarns at the proximal part (surface) try to have the same potential as each other. In this case, the potential at the proximal part between the polylactic acid twisted yarn 1 and the polylactic acid twisted yarn 2 becomes 0 V, and the positive potential in the inside of the polylactic acid twisted yarn 1 is further increased so as to keep the initial difference in potential. Similarly, the negative potential in the inside of the polylactic acid twisted yarn 2 is further decreased. In a cross-section of the polylactic acid twisted yarn 1, an electric field that directs from the center toward the outside is mainly generated. In a cross-section of the polylactic acid twisted yarn 2, an electric field that directs from the center toward the inside is mainly generated. Fringe electric fields are formed in spaces around the yarns, and the fringe electric fields are coupled with each other to form an intense electric field between the polylactic acid twisted yarn 1 and the polylactic acid twisted yarn 2.

The polylactic acid twisted yarn 1 and the polylactic acid twisted yarn 2 are arranged very close to each other, and therefore the distance between these yarns is almost 0. The intensity of the electric field is expressed by the formula: $E = V/d$, and increases in inverse proportion to the distance between substances that generate the electric charge. Therefore, the intensity of the electric field generated in the cloth 100A becomes very large. The electric field is formed by the coupling of the electric field generated in the polylactic acid twisted yarn 1 with the electric field generated in the polylactic acid twisted yarn 2. In some cases, a circuit may be formed as an actual electric current pathway by the action of electrolyte-containing moisture such as sweat. In a cloth formed by weaving fibers, the fibers are entangled complexly. Therefore, an electric field generated in a certain part in the polylactic acid twisted yarn 1 and an electric field generated in another part in the polylactic acid twisted yarn 1 are sometimes coupled with each other. Similarly, there is also a case where an electric field generated at a certain part in the polylactic acid twisted yarn 2 and an electric field generated in another part in the polylactic acid twisted yarn 2 are coupled with each other. Even in the case where the intensity of each of the electric fields is macroscopically zero or extremely weak, the electric fields may be coupled with each other to form a coupled entity in which the directions of vectors are microscopically inversed to each other. These phenomena can be explained similarly in a cloth made from only the polylactic acid twisted yarn 1, or a cloth made from only the polylactic acid twisted yarn 2, or a cloth in which the ordinary yarn or an electrically conductive yarn are also woven together with the polylactic acid twisted yarns 1 and 2.

Therefore, the cloth 100A can act as a cloth in which an electric field can be generated. In the cloth 100A, an electric current may flow between the polylactic acid twisted yarn 1 and the polylactic acid twisted yarn 2 through moisture such as sweat. This electric current may also induce the bacteriostatic effect or the bactericidal effect. Alternatively, the bacteriostatic effect of the bactericidal effect may be caused indirectly by a radical species which is produced by modifying oxygen contained in moisture by the action of an electric current or a voltage, or a radical species which is generated by the interaction with an additive material contained in the fibers or by a catalytic action, or another antibacterial chemical species (e.g., an amine derivative).

In this example, the polarity of the electric charge generated in the polylactic acid twisted yarn 1 and that in the polylactic acid twisted yarn 2 are different from each other. However, even in polylactic acid twisted yarns having the same polarity as each other, when there is a difference in potential in a space formed between the polylactic acid twisted yarns, an electric field can be generated, or an electric current can flow through an electrically conductive medium.

The cloth 100A can exhibit a bacteriostatic effect or a bactericidal effect which is caused by an electric field generated by itself and the change in the intensity of the electric field or by means of the electric current generated therein. Alternatively, the bacteriostatic effect or the bactericidal effect may be caused by a radical species or the like generated by the action of the electric current or the voltage. In the cloth 100A, an electrically conductive fiber capable of eluting a metal ion may be contained. In this case, the bacteriostatic or bactericidal effect of the cloth 100A can be further increased by a metal ion eluted from the electrically conductive yarn, in addition to the bacteriostatic or bactericidal effect caused by the electric field. The cloth 100A can also exhibit a bacteriostatic or bactericidal effect by a metal ion eluted from the electrically conductive yarn even when the polylactic acid twisted yarn 1 has a part where no electric charge is generated.

A garment produced using the cloth 100A or a medical member produced using the garment can also exhibit a bacteriostatic or bactericidal effect. Among garments each produced using the cloth 100A, socks (or a supporter) can particularly exhibit the effect significantly when used for antibacterial purposes, as mentioned above.

The cloth 100A exhibits a bacteriostatic or bactericidal effect by an electric field or an electric current generated in the polylactic acid twisted yarns 1 and 2 both constituting the cloth 100A. Therefore, the cloth 100A can exhibit the bacteriostatic or bactericidal effect against a bacterium transferred to the cloth 100A. It is believed that a bacterium that can cause a malodor occurs in gaps formed between fibers in a cloth. The cloth 100A can expel the bacterium effectively. On the human skin, there occur resident bacteria which have a function necessary for keeping the condition of the surface of the skin normal. However, the possibility that the cloth 100A kills these resident bacteria directly is small. Therefore, the cloth 100A is less likely to affect the resident bacteria on the skin, and is more highly safe.

Figure 2:
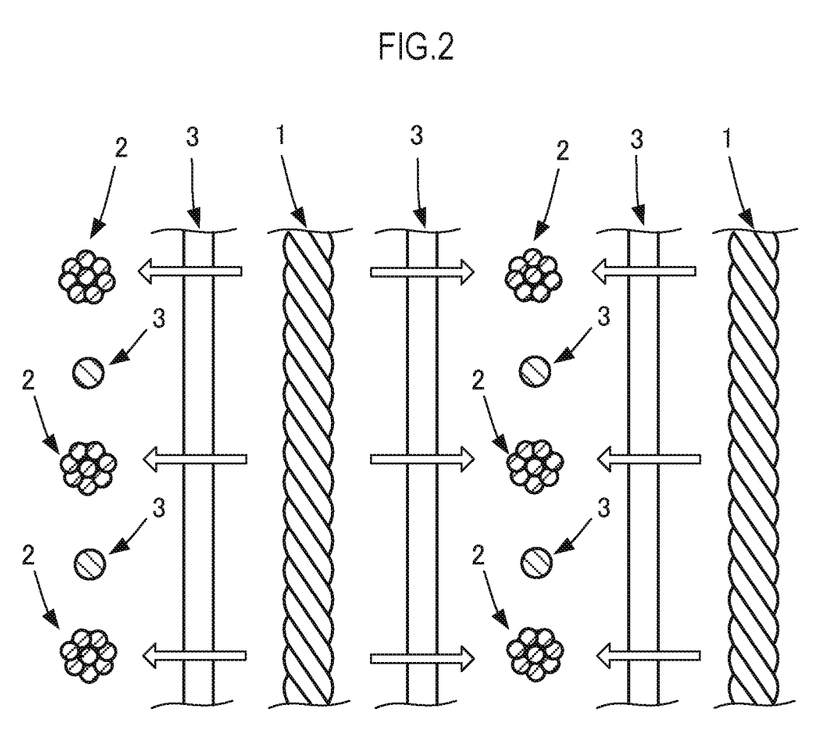
FIG. 2 is a view illustrating an electric field generated between yarns.

In an embodiment of a cloth 100A shown in FIG. 2 in which a polylactic acid twisted yarn 1, a polylactic acid twisted yarn 2 and an ordinary yarn 3 are arranged across with one another, an electric field is generated at a position where the polylactic acid twisted yarns 1 and 2 cross each other.

In the above-mentioned example, a cloth (woven fabric) in which multiple yarns including an electric charge generating yarn are weaved is shown in a cloth comprising a woven fabric (in which rings formed by multiple yarns including an electric charge generating yarn are entangled with each other), an electric field can also be generated or an electric current can also flow between yarns in which a difference in potential is generated and, as a result, a bacteriostatic or bactericidal effect can be exhibited.

Many bacteria have negative electric charge. Therefore, a cloth containing the polylactic acid twisted yarn 2 can adsorb many bacteria by the action of the positive electric charge generated in the cloth. A cloth containing the polylactic acid twisted yarn 2 can also deactivate bacteria having negative electric charge by the action of the positive electric charge generated in the cloth. As mentioned above, a cloth prepared using a polylactic acid twisted yarn capable of generating the positive electric charge on the surface thereof is highly effective as an antibacterial electric charge generation yarn.

The polylactic acid twisted yarn 1 or the polylactic acid twisted yarn 2 (or a cloth containing at least one of these polylactic acid twisted yarns) can be used in various use applications in addition to the antibacterial use.

(1) Biologically Active Yarn

Many of tissues constituting a living body have piezoelectric properties. For example, collagen which constitutes a living body is a kind of protein, and is contained in a large quantity in a blood vessel, a dermis, a ligament, a tendon, a bone, a cartilage and the like. Collagen is a piezoelectric material, and a tissue in which collagen is oriented often exhibits very high piezoelectricity. With respect to the piezoelectricity of a bone, there are found many reports (see, for example, "Piezoelectricity in Biopolymers", Eiichi Fukada, Polymer, Vol. 16 (1967), No. 9, pp. 795-800). Therefore, when an electric field is generated by a cloth containing the polylactic acid twisted yarn 1 or 2 and the electric field is alternated or the intensity of the electric field is altered, a piezoelectric material in the living body causes vibration due to the inverse piezoelectric effect thereof. A minute vibration is applied to a part of a living body (e.g., a capillary blood vessel or dermis) by means of the alternated electric field or the change in the intensity of the electric field which is caused by the polylactic acid twisted yarn 1 or 2. As a result, the improvement in blood flow at the part can be promoted. In this manner, the healing of a skin disease, a wound or the like may be promoted. Accordingly, the polylactic acid twisted yarn can act as a biologically active yarn.

(2) Yarn for Substance Adsorption Use

As mentioned above, the polylactic acid twisted yarn 1 generates the negative electric charge when undergoing elastic deformation. The polylactic acid twisted yarn 2 generates the positive electric charge when undergoing elastic deformation. Therefore, the polylactic acid twisted yarn 1 has a property to adsorb a substance having the positive electric charge (e.g., a particle such as a pollen), while the polylactic acid twisted yarn 2 has a property to adsorb a substance having the negative electric charge (e.g., a harmful substance such as yellow dust). Consequently, when a cloth containing the polylactic acid twisted yarn 1 or 2 is applied to a medical product such as a mask, the cloth can adsorb microparticles such as pollens and yellow dust.

Hereinbelow, the present invention will be described more specifically by way of examples. However, the present invent ion is not limited by these examples in any way.

(Polylactic Acid Fiber)

Poly-L-lactic acid having an optical purity of 99.8% and a weight-average molecular weight of 200,000 and melted at 240° C. (which was previously melt-kneaded with 1% by weight of a cyclic carbodiimide TCC (a carboxyl end-capping agent manufactured by TEIJIN LIMITED)) was ejected through a cap having 24 holes at a speed of 20 g/min.

and was then drawn at a speed of 887 m/min. An unstretched multifilament yarn thus produced was stretched by 2.3 folds at 80° C. and was then subjected to a thermal setting treatment at 100° C., thereby producing an 84-dTex/24 filaments multifilament monoaxially stretched yarn PF1.

(Polylactic Acid Twisted Yarn)

A twisted yarn, which was produced by each of the S-twisting and Z-twisting of PF1 (a raw yarn) at 2000 times/m using a double twister, was wound around a bobbin. The bobbin was placed in a steam vacuum setter to thermally set the twisted yarn under conditions shown in Table 1. The twisting conditions and the thermal setting conditions for twisted yarns PF2S, PF2Z, PF3S and PF3Z thus produced and the results of various evaluations on these twisted yarns are shown in Table 1 together with the results of the various evaluations on PF1.

and the sum total $\Sigma I_{HMi}$ of integrated intensities of the individual diffraction peaks which came from a poly-L-lactic acid crystal and appeared around 2θ=16.5°, 18.5° and 24.3° was determined. The crystallization degree $X_{homo}$ of poly-L-lactic acid was determined from these values in accordance with formula (4) shown below.

$$\text{Crystallization degree } X_{homo}(\%) \text{ of poly-}L\text{-lactic acid} = \Sigma I_{HMi} I_{total} \times 100 \quad (4)$$

The $\Sigma I_{Hmi}$ was calculated by subtracting the intensity of background or diffuse scattering associated with amorphous state in the total scattering intensity.

(2) Crystal Orientation Degree a of Poly-L-Lactic Acid:

A crystal orientation degree A of poly-L-lactic acid was determined in the following manner: in the X-ray diffraction image obtained above by the wide angle X-ray diffraction analysis (WAXD), an intensity distribution of diffraction

TABLE 1

| | | Number of twists (T/m) | Conditions for thermal setting | Total fineness (dtex) | Number of filaments | Single fiber fineness (dtex) | Twist factor (T/m · dtex$^{0.5}$) | Double torque (times/m) | Optical purity | Weight-average molecular weight |
|---|---|---|---|---|---|---|---|---|---|---|
| PF1 | Poly-L-lactic acid untwisted yarn | 0 | None | 84 | 24 | 3.5 | 0 | 0 | 99.84% | 210,000 |
| PF2S | S-twisted yarn using PF1 | 2000 | 50° C., for 90 minutes | 92 | 24 | 3.8 | 19183 | 53 | 99.84% | 210,000 |
| PF2Z | Z-twisted yarn using PF1 | 2000 | 50° C., for 90 minutes | 92 | 24 | 3.8 | 19183 | 60 | 99.80% | 210,008 |
| PF3S | S-twisted yarn using PF1 | 2000 | 85° C., for 90 minutes | 92 | 24 | 3.8 | 19183 | 7 | 99.83% | 210,000 |
| PF3Z | Z-twisted yarn using PF1 | 2000 | 85° C., for 90 minutes | 92 | 24 | 3.8 | 19183 | 8 | 99.81% | 210,000 |

| | | Carboxyl ends (mol/ton) | Crystallization degree | Orientation degree | Fiber strength (cN/dtex) | Resistivity (MΩ/m) | Shrinkage ratio in boiling water | Uster irregularity |
|---|---|---|---|---|---|---|---|---|
| PF1 | Poly-L-lactic acid untwisted yarn | 1 | 40% | 95% | 3.3 | 200 or more | 5% | 1% |
| PF2S | S-twisted yarn using PF1 | 2 | 40% | | 2.1 | 200 or more | | |
| PF2Z | Z-twisted yarn using PF1 | 2 | 40% | | 1.9 | 200 or more | | |
| PF3S | S-twisted yarn using PF1 | 1 | 43% | | 2.0 | 200 or more | | |
| PF3Z | Z-twisted yarn using PF1 | 2 | 40% | | 2.2 | 200 or more | | |

Hereinbelow, the methods for the evaluations of properties will be described.

(1) Crystallization degree $X_{homo}$ of poly-L-lactic acid:

The crystallization degree $X_{homo}$ of poly-L-lactic acid was determined by a crystalline structure analysis by wide angle X-ray diffraction analysis (WAXD), in the wide angle X-ray diffraction analysis (WAXD), an X-ray diffraction image of a sample was recorded on an imaging plate under the below-mentioned conditions by a transmission method using an ultrax18 model X-ray diffraction device manufactured by Rigaku Corporation.

X-ray source: Cu-Kα line (a confocal mirror)
Output: 45 kV×60 mA
Slit: 1st: 1 mmΦ, 2nd: 0.8 mmΦ
Camera length: 120 mm
Cumulative time: 10 minutes
Sample: Polylactic acid fibers each having a weight of 35 mg are paralleled to form a fiber bundle having a length of 3 cm.

In an X-ray diffraction image thus obtained, the total scattering intensity $I_{total}$ was determined at azimuth angles, peaks which came from a poly-L-lactic acid crystal and appeared around 2θ=16.5° in a radial direction was obtained at azimuth angles (°), and then the crustal orientation degree A of poly-L-lactic acid was calculated from the sum total $\Sigma W_i$ (°) of half-value widths of the distribution profile in accordance with formula (5).

$$\text{Crystal orientation degree } A(\%) \text{ of poly-}L\text{-lactic acid} = (360 - \Sigma W_i) \div 360 \times 100 \quad (5)$$

(3) Shrinkage Ratio in Boiling Water

A shrinkage ratio in boiling water (a shrinkage ratio in hot water) (%) was measured by a method prescribed in JIS L 1013-1992, 7.15 A method. The shrinkage ratio in boiling water was measured for three samples (n=3), and an average of measurement values was determined.

(4) Uster Irregularity

Uster irregularity was measured using an evenness tester by feeding a sample to a detection end in the evenness tester at a feeding speed of 100 m/min. while twisting the sample at a ratio of 5500 times/min. The shrinkage ratio in boiling water was measured for three samples (n=3), and an average of measurement values was determined.

(5) Total Fineness and Twist Factor

The weight of each of samples, each of which was prepared by cutting a twisted yarn sample to a length of 10 m, was measured while applying an initial load of 25 mN to the sample and while avoiding the untwisting of the sample. The value is multiplied with 1,000. In this test, the measurement was carried out for two samples (n=2), and the measurement values were averaged to determine a total fineness (dtex).

The number of twists was calculated from the conditions employed in the twisting step, and the twist factor was calculated in accordance with formula (6) shown below.

$$\text{Twist factor}(T/m \cdot (\text{dtex}^{1/2})) = (\text{number of twists})(T/m) \times (\text{total fineness of twisted yarn}(\text{dtex})^{1/2}) \quad (6)$$

(6) Double Torque

A twisted yarn having a length of 1 m was sampled on a desk while avoiding the application of a tension of 1 g or more to the twisted yarn. The sampling was carried out at a part of the twisted yarn which was 1 m or longer apart from a cut end of the twisted yarn. In the sampling, an adhesive tape was attached to a cutting position in the twisted yarn before the cutting of the twisted yarn, so as to avoid the spontaneous untwisting of the twisted yarn after the cutting.

An end of the sampled twisted yarn having a length of 1 m was passed through a hole of a gem clip having a weight of 0.4 g, and then the gel clip was moved to the center part (a part positioned 50 cm apart from of the end) of the twisted yarn. In this test, care was taken not to apply a tension to the twisted yarn or not to twist or untwisted the twisted yarn during the passing of the twisted yarn through the gem clip and the movement of the gem clip.

Both ends of the twisted yarn are held up slowly by both hands, and then the both ends are put together. The ends of the yarn which were put together were fixed to a joist with an adhesive tape to suspend the gem clip on the yarn.

The yarns were allowed to leave for five minutes until the rotational motion of the gem clip stopped. Subsequently, the yarns were rotated in an inverse direction to the direction of the rotational movement of the gem clip until the two twisted yarns were untwisted, and the number of rotations of the gem clip was measured at a precision of 0.5.

The sampling and the measurement were repeated five times, and the measurement values were averaged to determine a double torque value (T/50 cm).

(7) Optical Purity of Polylactic Acid

Polylactic acid fibers (0.1 g) were collected, and then an aqueous sodium hydroxide solution having a concentration of 5 moles/liter (1.0 mL) and methanol (1.0 mL) were added thereto. The resultant solution was placed in a water bath shaker set at 65° C. to perform the hydrolysis of the solution for about 30 minutes until a homogeneous solution of polylactic acid was obtained. Sulfuric acid having a concentration of 0.25 mole/liter was added to the hydrolyzed solution to neutralize the solution to pH 7. The resultant decomposed solution (0.1 mL) was collected and was then diluted with a high-performance liquid chromatography (HPLC) mobile phase solution (3 mL), and the resultant solution was filtrated through a membrane filter (0.45 μm). The prepared solution was subjected to an HPLC measurement to qtantify the content ratio between L-lactic acid monomers and D-lactic acid monomers.

<Conditions for HPLC Measurement>

Column: "SUMICHIPAL" (registered trademark) OA-5000 (4.6 mmφ×150 mm), manufactured by Sumika Chemical Analysis Service, Ltd.

Mobile phase: an aqueous copper sulfate solution having a concentration of 1.0 millimole/liter.

Flow rate of mobile phase: 1.0 milliliter/min.

Detector: an UTV detector (wavelength: 254 nm).

Injection amount: 100 microliters.

When the peak area coming from an L-lactic acid monomer is represented by $S_{LLA}$ and the peak area coming from a D-lactic acid monomer is represented by $S_{DLA}$, $S_{LLA}$ and $S_{DLA}$ are proportional to the molar concentration $M_{LLA}$ of an L-lactic acid monomer and the molar concentration $M_{DLA}$ of a D-lactic acid monomer, respectively. Therefore, $S_{LLA}$ or $S_{DLA}$, whichever was larger, was defined as $S_{MLA}$, and optical purity was calculated in accordance with formula (7) shown below.

$$\text{Optical purity}(\%) = S_{MLA} \div (S_{LLA} + S_{DLA}) \times 100 \quad (7)$$

(8) Concentration of Carboxyl Terminal Groups

A sample was completely dissolved in chloroform, and then methanol was added dropwise to the solution. A reprecipitated polymer was filtrated and the residue was dried under vacuum at ambient temperature. The resultant polymer sample (100 mg) was dissolved in purified dichloromethane (10 ml) under a nitrogen gas stream, and purified ethanol (10 ml) was then added thereto. The resultant solution was stirred, and was then titrated with a 0.05 N potassium hydroxide solution in ethanol using bromothymol blue as an indicator.

A titration value of a dichloromethane-ethanol mixed solution, which was prepared in the same manner except that no polymer was added, was subtracted as a blank from a measurement value. A concentration of carboxyl terminal groups was calculated by averaging measurement values that were determined for three samples (n=3).

(9) Fiber Strength

A tensile strength (cN/dtex) was measured by a method prescribed in JIS L 1013-1992, 7.5. The shrinkage ratio in boiling water was measured for three samples (n=3), and an average of measurement values was determined. As the fineness, a value of a total fineness determined as mentioned in the section "(5) Total fineness and twist factor".

(10) Resistivity

A sample was cut to 1 m, both ends of the sample were gripped with electrodes and were then held in air. The resistance value between the electrodes at the both ends was measured using a tester (upper limit of the resistance measurement: 200 MΩ) to evaluate resistivity.

(Evaluation of Antibacterial Properties)

Evaluation of antibacterial properties was carried out by a bacterial liquid absorption method as prescribed in JIS L1902-2015 using a test cloth prepared by weaving a combined strand of PF3S and PF3Z as polylactic acid twisted yarns and a comparative test cloth prepared by weaving an untwisted polylactic acid yarn (PF1). A test bacterium to be used was Staphylococcus aureus, the concentration of a bacterial liquid to be seeded was $1.4 \times 10^5$ (CFU/mL), and the standard cloth to be used was a cotton fiber cloth. The same test was carried out on each of the case where the bacterium was cultured while allowing the test cloth to stand and the case where the bacterium was cultured while applying elastic deformation to the test cloth such that the state of the test cloth was shuttled between the initial state and a tensile strain of 15%. The results of the test are shown Table 2.

TABLE 2

| Fiber used | | Value of bacteriostatic activity | |
| --- | --- | --- | --- |
| | | Allowed to stand | Stretched |
| Example 1 | PF3S and PF3Z | 1.1 | 4.0 |
| Comparative Example 1 | PF1 | 0.3 | 0.0 |

From the above-mentioned results, it was demonstrated that a cloth prepared using a polylactic acid twisted yarn exhibited particularly excellent antibacterial properties upon being stretched and contracted, and was observed to exhibit antibacterial properties coming from piezoelectricity, and was therefore useful as an antibacterial electric charge generation yarn. In contrast, a cloth prepared using a polylactic acid untwisted yarn did not exhibit superior antibacterial properties during stretching and contracting compared with those during being allowed to stand, and therefore the improved in antibacterial properties coming from piezoelectricity was not observed. When the comparison was made with respect to antibacterial properties during stretching and contraction, it was demonstrated that a cloth prepared using a polylactic acid twisted yarn exhibited drastically higher antibacterial properties compared with a cloth prepared using a polylactic acid untwisted yarn.

PF2S and PF2Z, each of which was prepared at a low thermal setting temperature, were very poor in nandling properties and were difficult to weave, because slack yarns were twisted and entangled rapidly.

REFERENCE SIGNS LIST 1 polylactic acid twisted yarn 1 (S-twisted yarn composed of poly-L-lactic acid)
2 polylactic acid twisted yarn 2 (Z-twisted yarn composed of poly-L-lactic acid)
3 ordinary yarn
100A cloth

The invention claimed is:

1. An antibacterial electric charge generation yarn which meets requirements (a) to (f) and (h) to (j) mentioned below simultaneously and suppresses proliferation of bacteria by electric charge generated upon deformation of the yarn:
   (a) a main component of the yarn is polylactic acid;
   (b) the yarn is twisted;
   (c) the yarn has a double torque of 50 T/50 cm or less;
   (d) the yarn has a single fiber fineness of 0.05 to 5 dtex;
   (e) a number of filaments in the yarn is 10 to 400;
   (f) the yarn has an optical purity of 97 to 100%;
   (h) the yarn has a crystallization degree of 30 to 60%;
   (i) the yarn has a fiber strength of 1.5 to 10 cN/dtex; and
   (j) the yarn has a resistivity of 1 MΩ/m or more.

2. The antibacterial electric charge generation yarn according to claim 1, wherein the yarn additionally meets requirement (g) below:
   (g) a concentration of carboxyl terminal groups in the yarn is 0 to 10 mol/ton.

3. A method for producing the antibacterial electric charge generation yarn according to claim 1, comprising subjecting polylactic acid fibers each of which meets properties (A) to (D) mentioned below to steps (1) to (2) mentioned below sequentially:
   (A) each of fibers has a crystallization degree of 30 to 60%;
   (B) each of the fibers has an orientation degree of 80 to 99%;
   (C) each of the fibers has a shrinkage ratio in boiling water of 0 to 15%;
   (D) each of the fibers has an Uster irregularity (U %) of 0 to 3%;
   step (1) of twisting the polylactic acid fibers; and
   step (2) of thermally setting the polylactic acid fibers, which have been twisted in step (2), at 60 to 140° C. for 10 to 240 minutes.

4. An antibacterial fabric cloth comprising the antibacterial electric charge generation yarn according to claim 1.

5. The antibacterial fabric cloth according to claim 4, wherein the fabric cloth comprises [at least one antibacterial electric charge generation yarn selected from an S-twisted yarn mainly comprising poly-L-lactic acid and a Z-twisted yarn mainly comprising poly-D-lactic acid] and [at least one antibacterial electric charge generation yarn selected from a Z-twisted yarn mainly comprising poly-L-lactic acid and an S-twisted yarn mainly comprising poly-D-lactic acid], wherein both of the yarns are arranged so as to be adjacent to each other in the fabric cloth.

6. A method for producing the antibacterial electric charge generation yarn according to claim 2, comprising subjecting polylactic acid fibers each of which meets properties (A) to (D) mentioned below to steps (1) to (2) mentioned below sequentially:
   (A) each of fibers has a crystallization degree of 30 to 60%;
   (B) each of the fibers has an orientation degree of 80 to 99%;
   (C) each of the fibers has a shrinkage ratio in boiling water of 0 to 15%;
   (D) each of the fibers has an Uster irregularity (U %) of 0 to 3%;
   step (1) of twisting the polylactic acid fibers; and
   step (2) of thermally setting the polylactic acid fibers, which have been twisted in step (2), at 60 to 140° C. for 10 to 240 minutes.

7. An antibacterial fabric cloth comprising the antibacterial electric charge generation yarn according to claim 2.

8. The antibacterial fabric cloth according to claim 7, wherein the fabric cloth comprises [at least one antibacterial electric charge generation yarn selected from an S-twisted yarn mainly comprising poly-L-lactic acid and a Z-twisted yarn mainly comprising poly-D-lactic acid] and [at least one antibacterial electric charge generation yarn selected from a Z-twisted yarn mainly comprising poly-L-lactic acid and an S-twisted yarn mainly comprising poly-D-lactic acid], wherein both of the yarns are arranged so as to be adjacent to each other in the fabric cloth.

* * * * *